(12) United States Patent
Sherrer et al.

(10) Patent No.: US 6,627,096 B2
(45) Date of Patent: Sep. 30, 2003

(54) SINGLE MASK TECHNIQUE FOR MAKING POSITIVE AND NEGATIVE MICROMACHINED FEATURES ON A SUBSTRATE

(75) Inventors: David W. Sherrer, Blacksburg, VA (US); Gregory A. Ten Eyck, Blacksburg, VA (US); Dan A. Steinberg, Blacksburg, VA (US); Neal Ricks, Blacksburg, VA (US)

(73) Assignee: Shipley Company, L.L.C., Marlborough, MA (US)

( * ) Notice: Subject to any disclaimer, the term of this patent is extended or adjusted under 35 U.S.C. 154(b) by 336 days.

(21) Appl. No.: 09/847,798

(22) Filed: May 2, 2001

(65) Prior Publication Data

US 2001/0050266 A1 Dec. 13, 2001

Related U.S. Application Data

(60) Provisional application No. 60/201,348, filed on May 2, 2000.

(51) Int. Cl.[7] .............................................. H01L 21/00
(52) U.S. Cl. ............................ 216/24; 216/41; 216/79; 216/99; 385/65; 385/83; 43/31; 43/733; 43/753
(58) Field of Search ................................ 216/2, 24, 67, 216/41, 79, 99; 438/31, 719, 733, 745, 753; 385/65, 83, 89, 91; 257/84, 117

(56) References Cited

U.S. PATENT DOCUMENTS

| 4,004,341 A | 1/1977 | Tung |
| 4,013,532 A | 3/1977 | Cormia et al. |
| 4,079,404 A | 3/1978 | Comerford et al. |
| 4,212,719 A | 7/1980 | Osada et al. |
| 4,326,330 A | 4/1982 | LePage et al. |
| 4,453,305 A | 6/1984 | Janes et al. |
| 4,692,998 A | 9/1987 | Armstrong et al. |
| 4,730,198 A | 3/1988 | Brown et al. |
| 4,779,946 A | 10/1988 | Pimpinella et al. |
| 4,810,557 A | 3/1989 | Blonder |
| 4,863,560 A | 9/1989 | Hawkins |
| 4,927,784 A | 5/1990 | Kazior et al. |
| 4,945,400 A | 7/1990 | Blonder et al. |
| 4,957,592 A | 9/1990 | O'Neill |
| 5,042,709 A | 8/1991 | Cina et al. |
| 5,163,108 A | 11/1992 | Armiento et al. |
| 5,179,609 A | 1/1993 | Blonder et al. |
| 5,185,293 A | 2/1993 | Franke et al. |
| 5,259,054 A | 11/1993 | Benzoni et al. |
| 5,268,066 A | 12/1993 | Tabasky et al. |
| 5,337,398 A | 8/1994 | Benzoni et al. |
| 5,355,386 A | 10/1994 | Rothman et al. |

(List continued on next page.)

FOREIGN PATENT DOCUMENTS

GB  2 215 087 A  9/1989

*Primary Examiner*—William A. Powell
(74) *Attorney, Agent, or Firm*—Jonathan D. Baskin

(57) ABSTRACT

Methods for making a micromachined device (e.g. an microoptical submount) having positive features (extending up from a device surface) and negative features (extending into the device surface). The present techniques locate the postive feature and negative features according to a single mask step. In one embodiment, a hard mask is patterned on top of the device layer of an SOI wafer. Then, RIE is used to vertically etch to the etch stop layer, forming the positive feature. Then, the positive feature is masked, and metal or hard mask is deposited on the exposed areas of the etch stop layer. Then, portions of the device layer are removed, leaving the patterned metal layer on the etch stop layer. Then, the etch stop layer is removed in an exposed area, uncovering the handle layer. Then, the handle layer is etched in an exposed area to form the negative feature.

39 Claims, 15 Drawing Sheets

U.S. PATENT DOCUMENTS

| | | |
|---|---|---|
| 5,436,996 A | 7/1995 | Tabasky et al. |
| 5,499,732 A | 3/1996 | Nishimoto |
| 5,522,000 A | 5/1996 | Ayliffe et al. ................. 385/88 |
| 5,550,088 A | 8/1996 | Dautartas et al. |
| 5,632,908 A | 5/1997 | Shahid .......................... 216/2 |
| 5,719,073 A | 2/1998 | Shaw et al. |
| 5,738,757 A | 4/1998 | Burns et al. |
| 5,815,616 A | 9/1998 | Bishop et al. |
| 5,862,283 A | 1/1999 | Trott et al. |
| 5,896,481 A | 4/1999 | Beranek et al. |
| 5,961,849 A | 10/1999 | Bostock et al. |
| 5,964,397 A | 10/1999 | Dautartas |
| 5,966,486 A | 10/1999 | Boudreau et al. |
| 6,023,339 A | 2/2000 | Haugsjaa et al. |

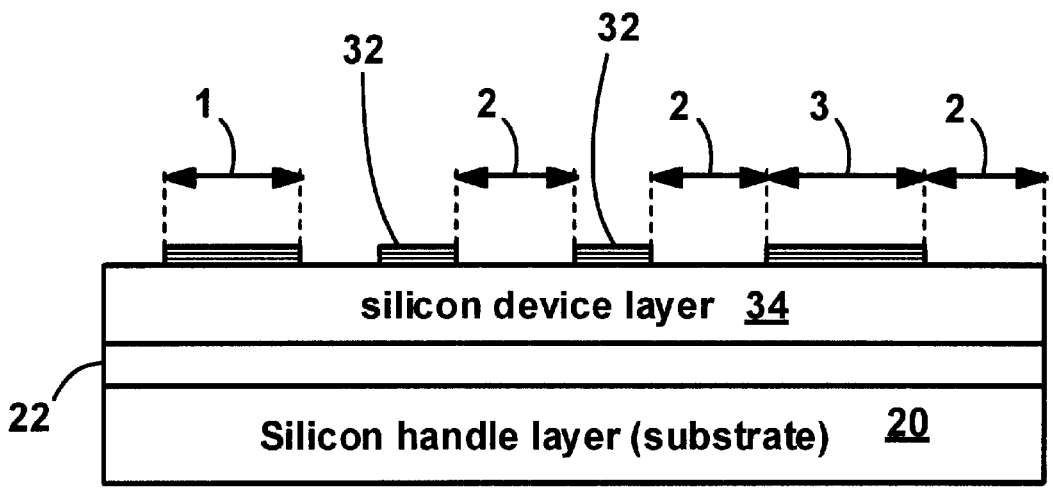
Fig. 3a: Deposit hard mask pattern
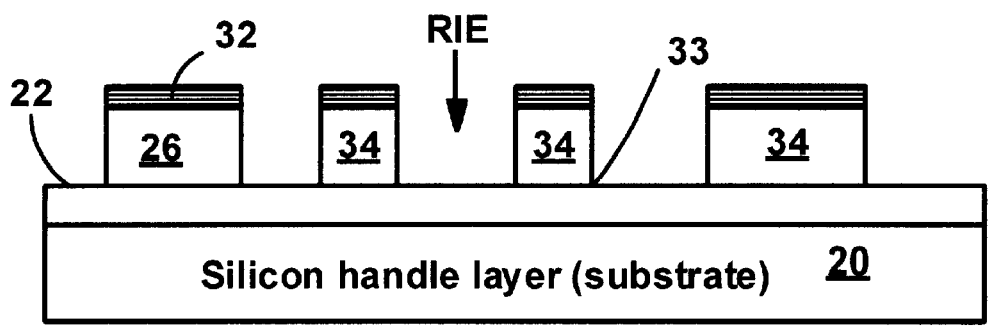
Fig. 3b: RIE to etch-stop layer
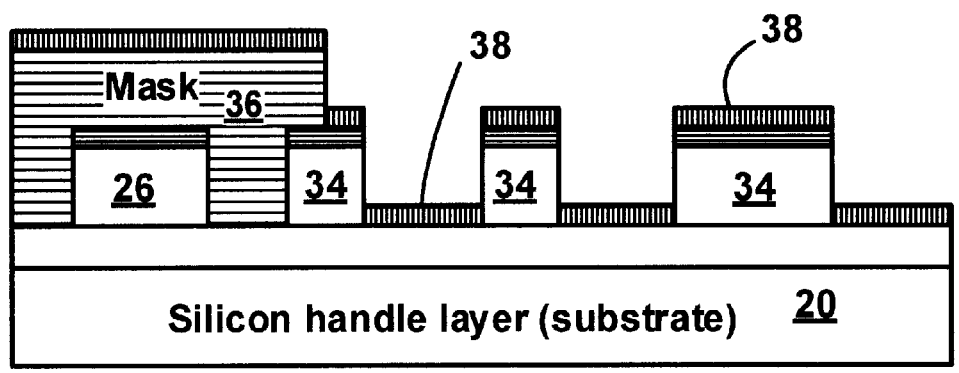
Fig. 3c: Deposit mask 36 and metal

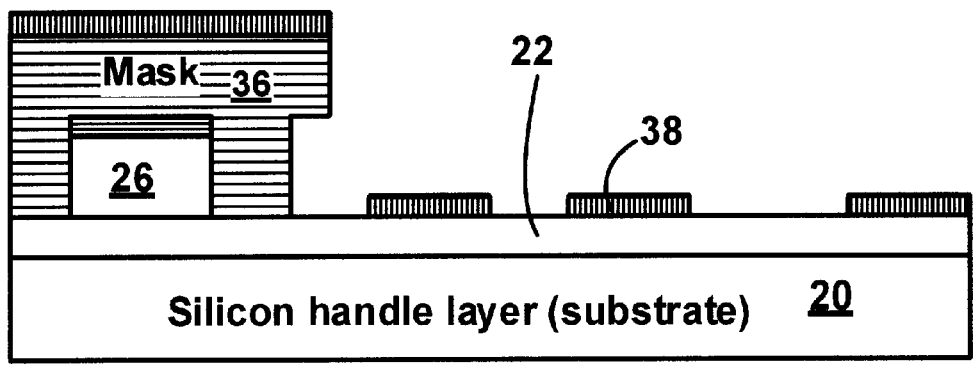
Fig. 3d: Etch silicon device layer
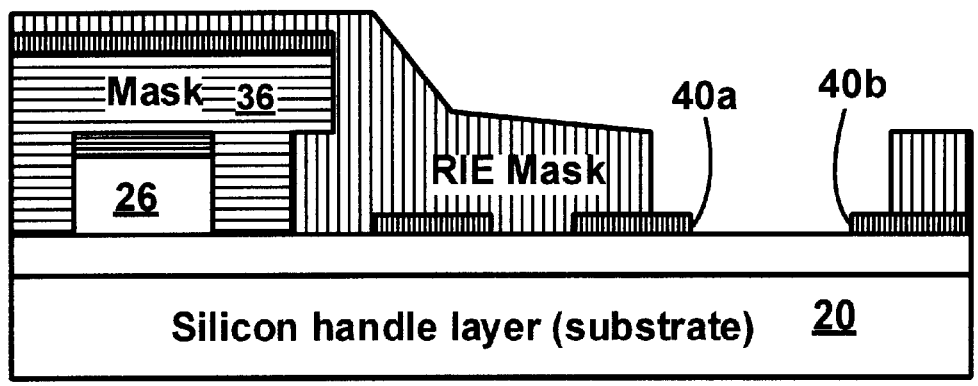
Fig. 3e: Deposit RIE mask
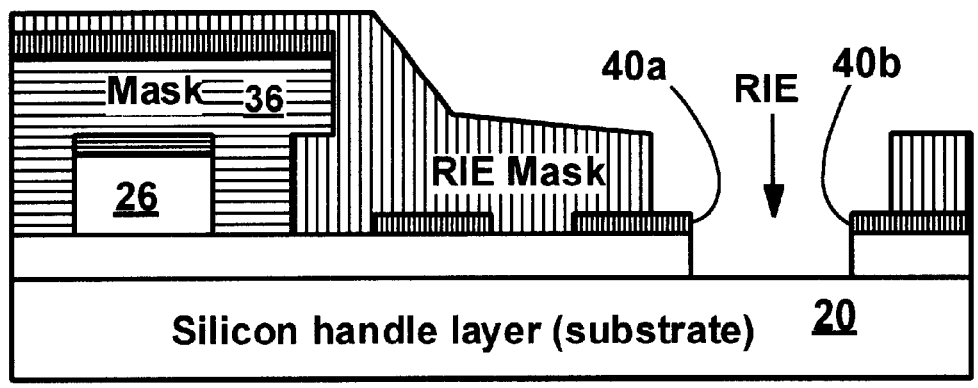
Fig. 3f: RIE through etch stop layer

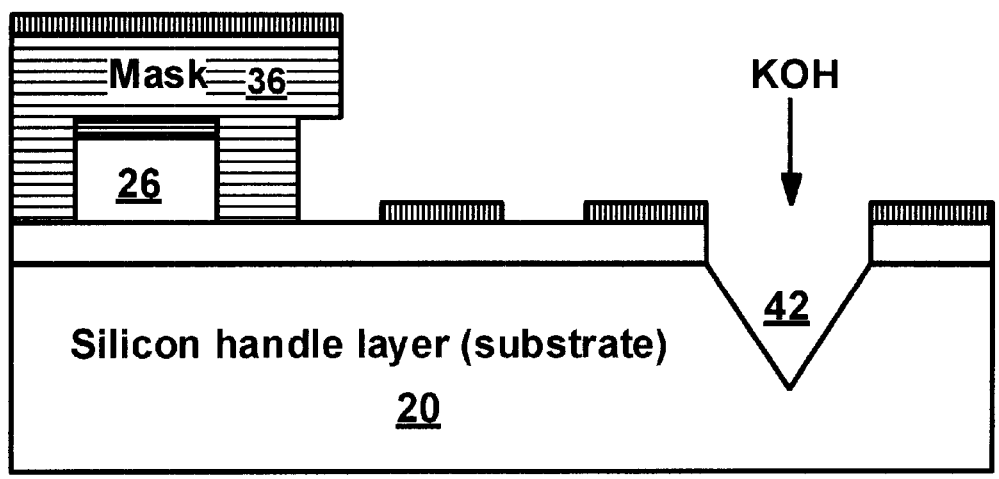
Fig. 3g: Wet etch to form V-groove
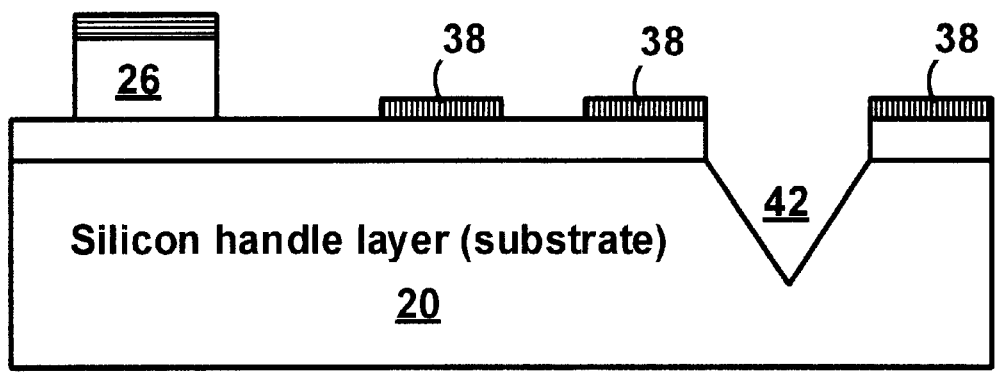
Fig. 3h: Remove all masks
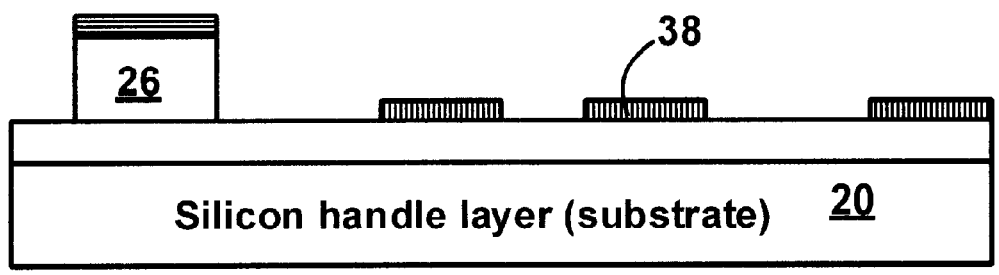
Fig. 4a: After Fig. 3d, Remove mask 36

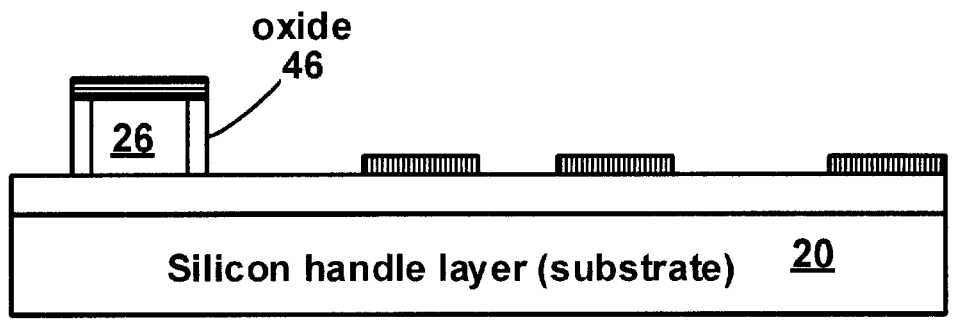
Fig. 4b: Oxidize post 26
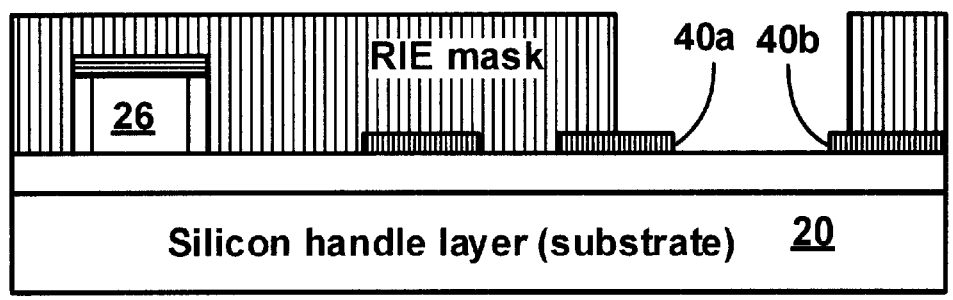
Fig. 4c: Pattern RIE mask
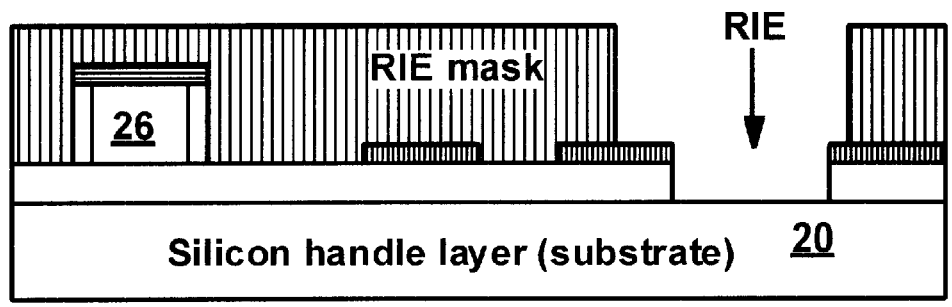
Fig. 4d: RIE through etch stop layer
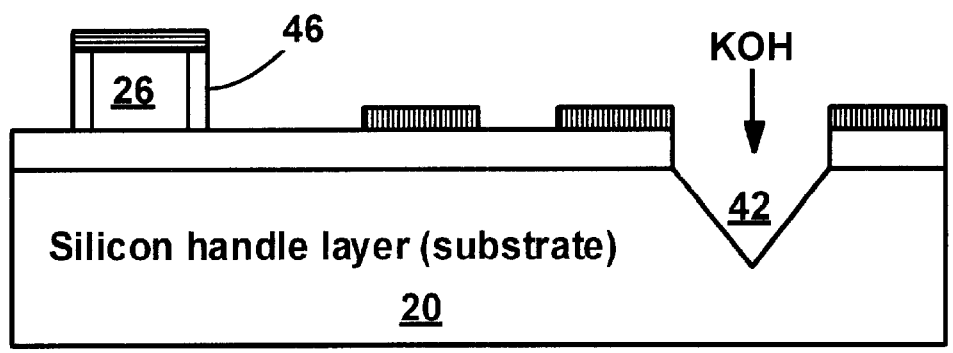
Fig. 4e: Wet etch handle layer

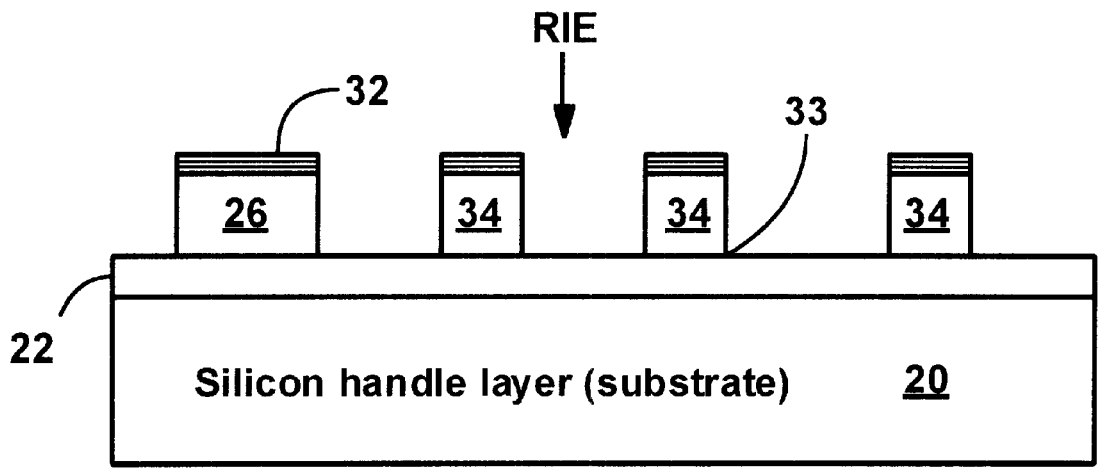
Fig. 5a: RIE to etch-stop layer
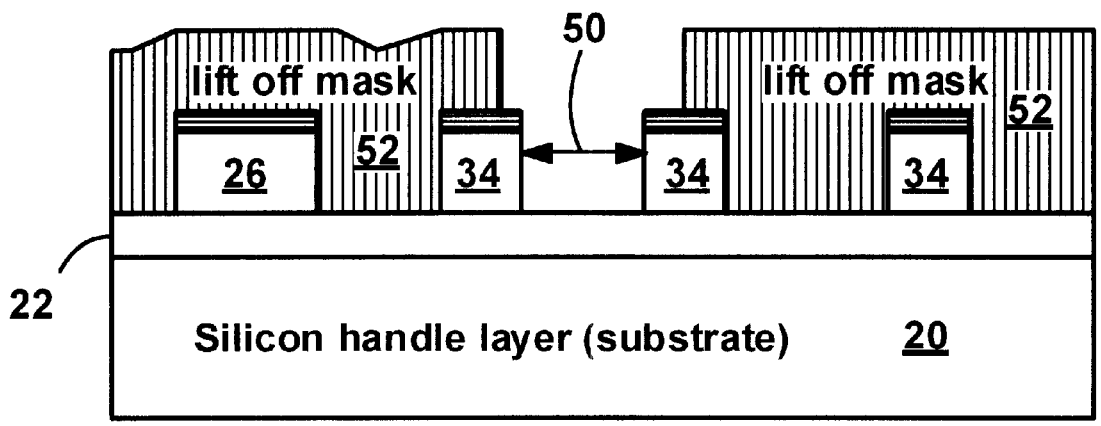
Fig. 5b: Deposit/pattern mask 52
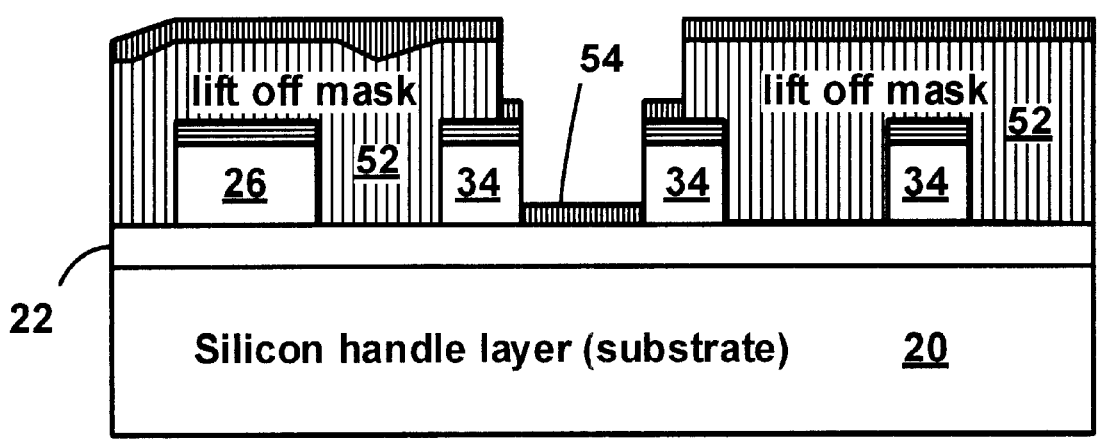
Fig. 5c: Deposit metal

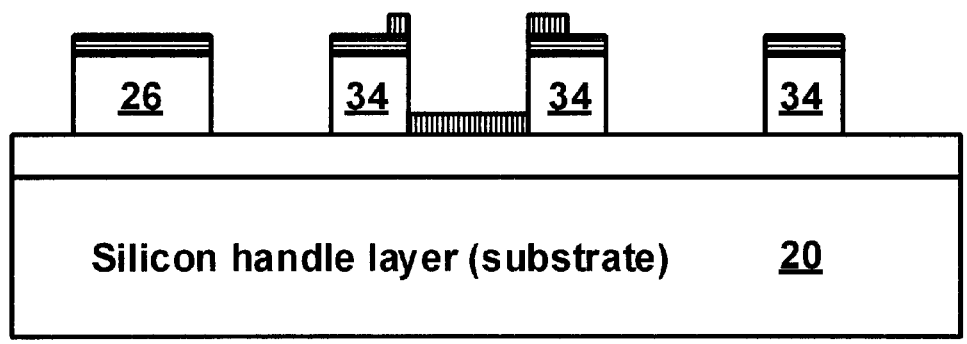
Fig. 5d: Remove mask 52
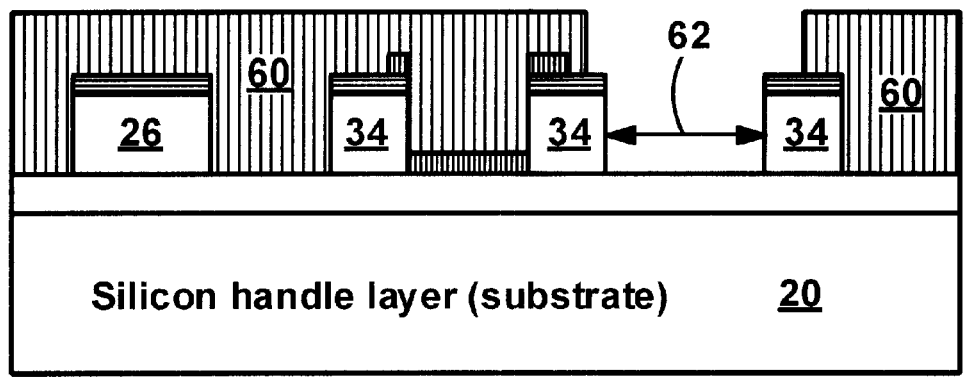
Fig. 5e: Apply new mask 60
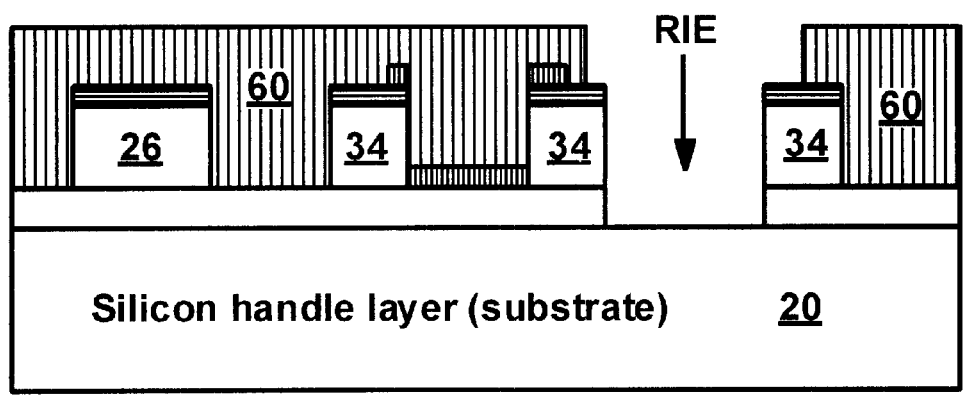
Fig. 5f: RIE through etch stop

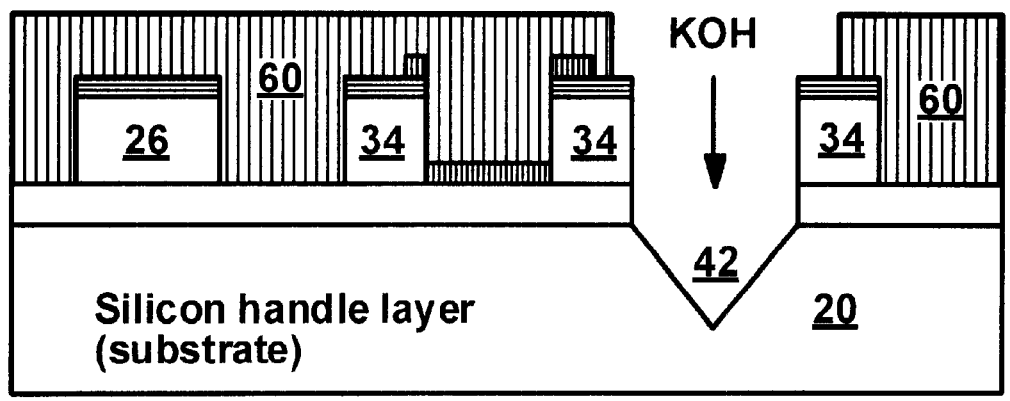
Fig. 5g: Wet etch to form V-groove
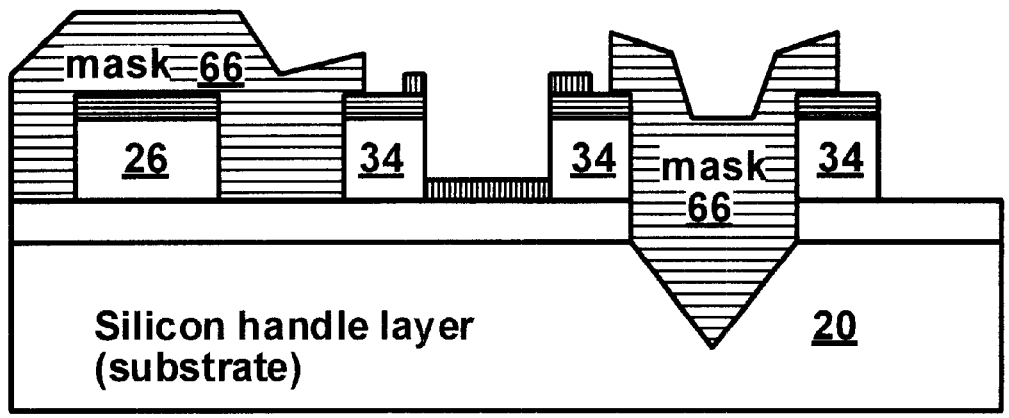
Fig. 5h: Remask to protect post and groove
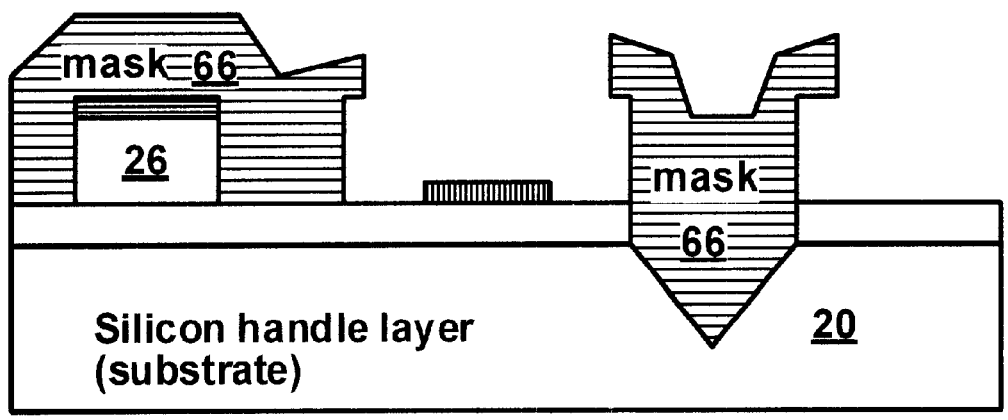
Fig. 5i: Remove device layer

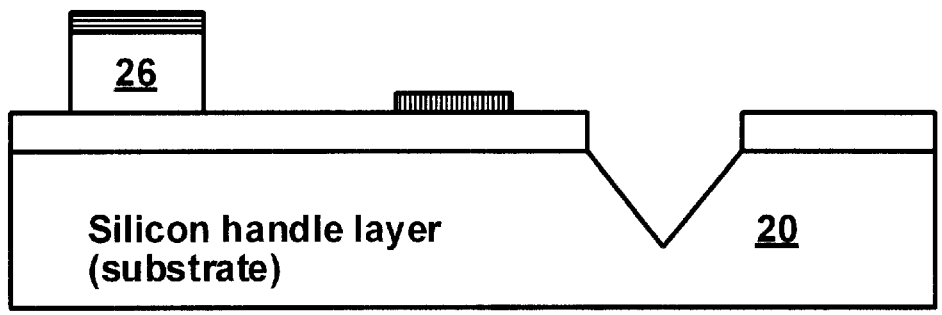
Fig. 5j: Remove mask 66
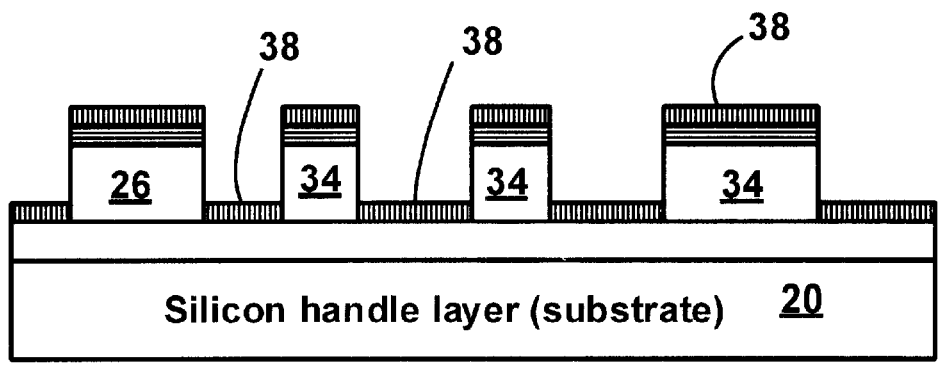
Fig. 6a: Deposit metal
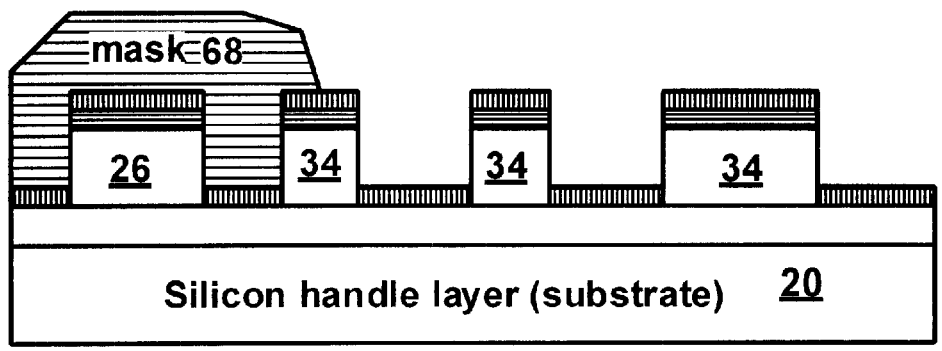
Fig. 6b: Deposit mask 68
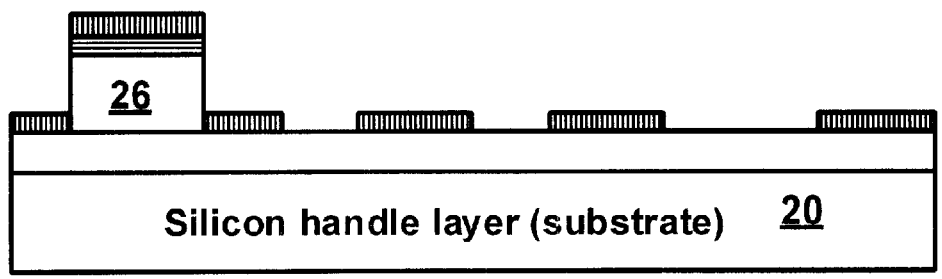
Fig. 6c: Remove device layer 34 &mask 68

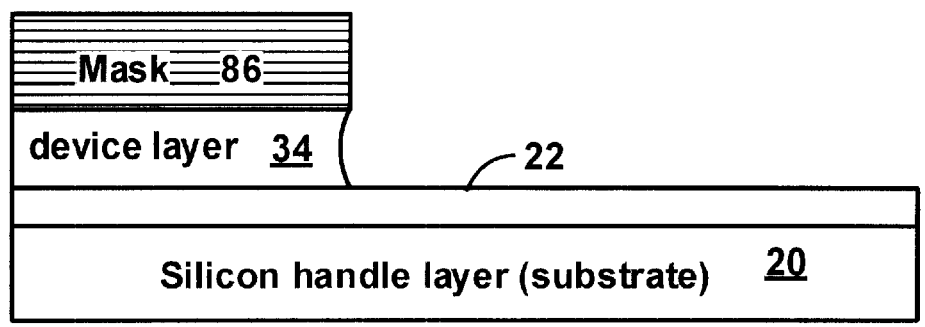
Fig. 7a: Remove device layer
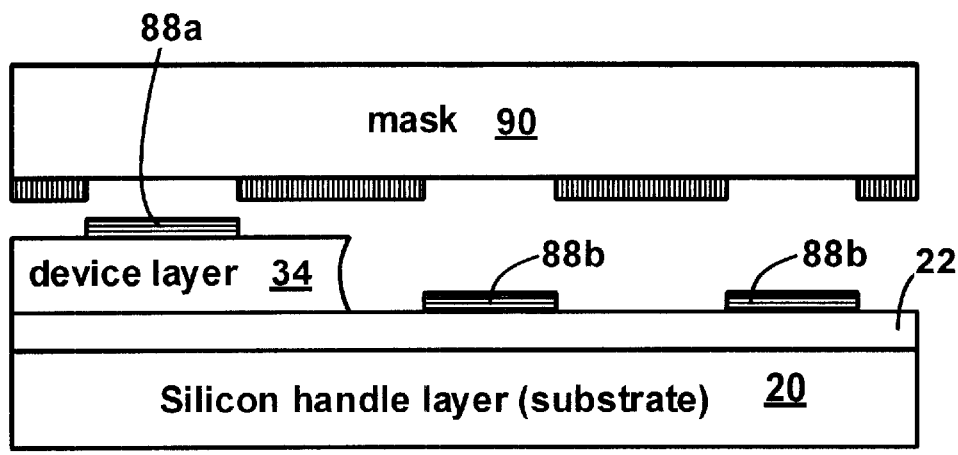
Fig. 7b: Deposit patterned metal layer
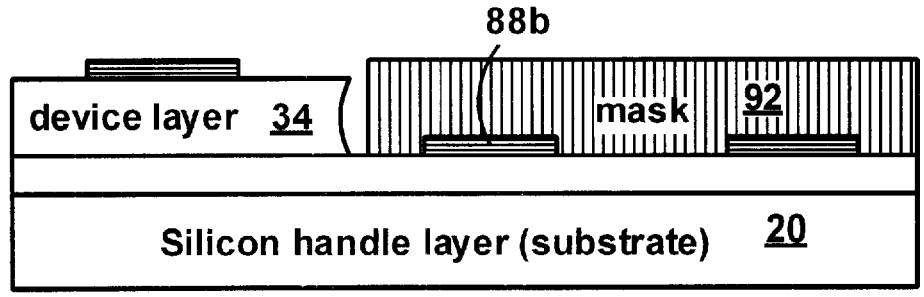
Fig. 7c: Deposit mask
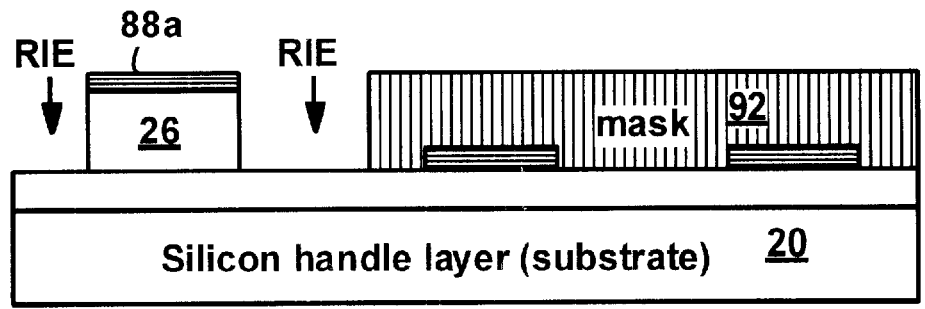
Fig. 7d: RIE to produce post 26

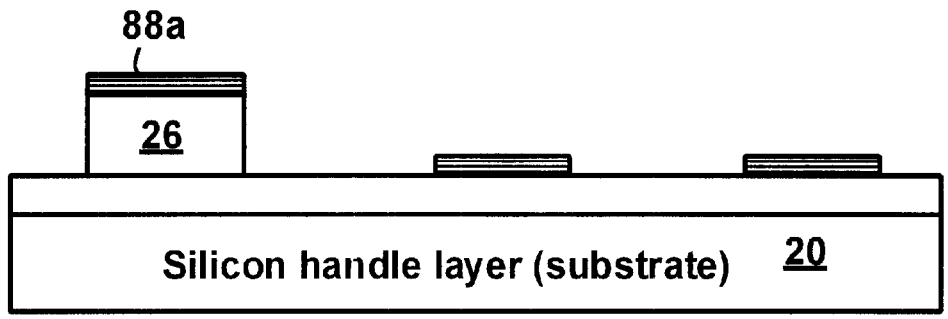
Fig. 7e: Remove mask 92
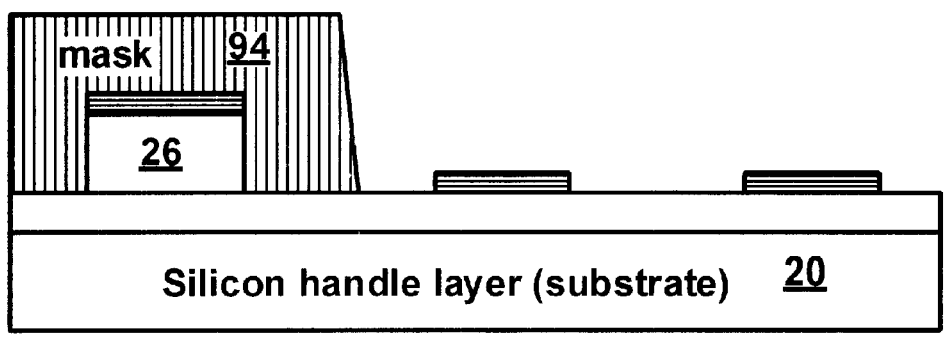
Fig. 8: Apply mask 94
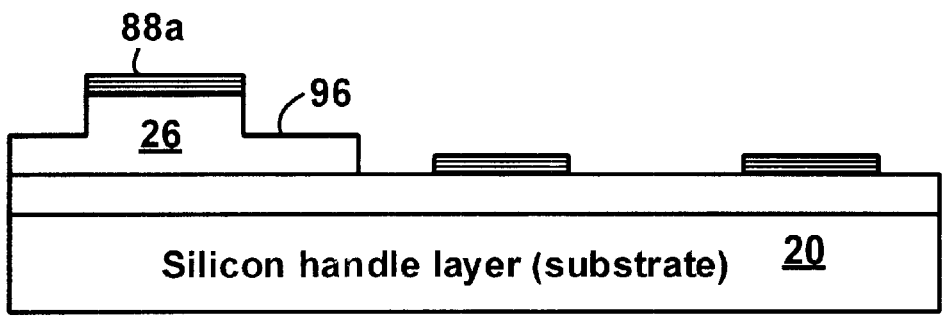
Fig. 9: Positive feature with step
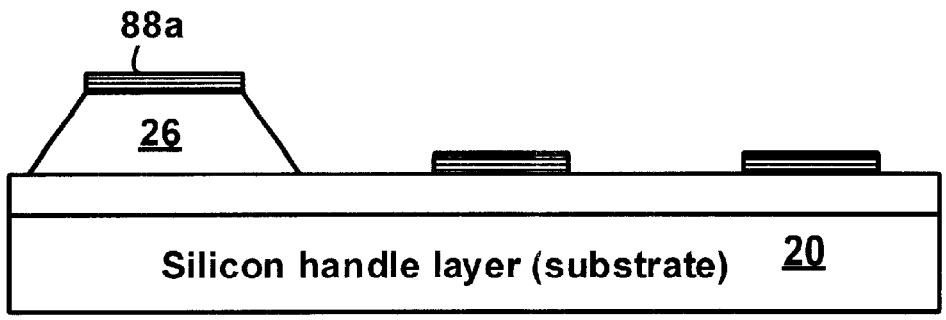
Fig. 10: ODE-formed positive feature

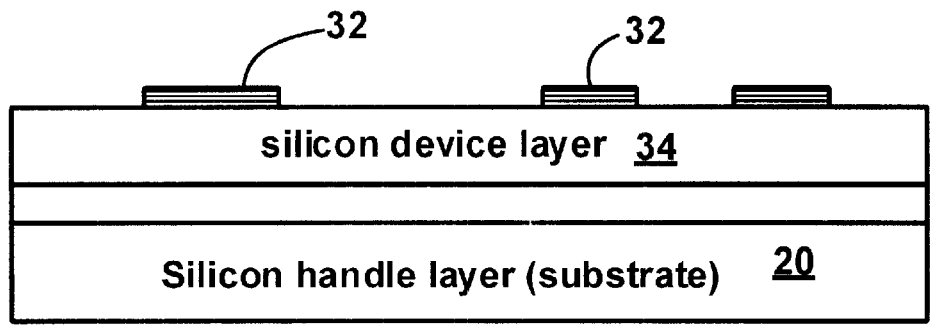
Fig. 11a: Deposit hard mask pattern
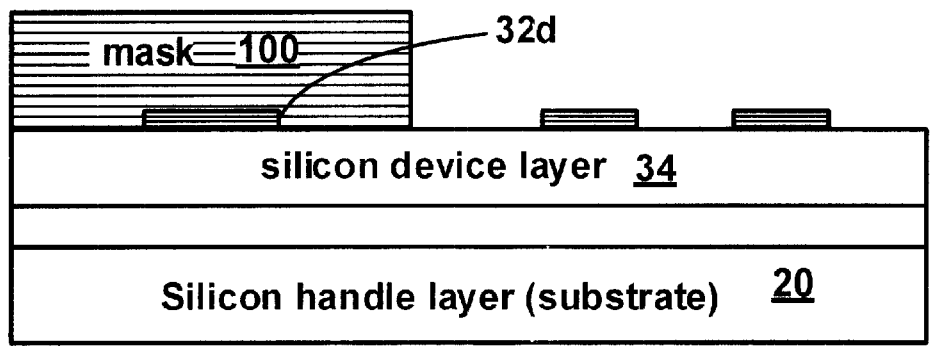
Fig. 11b: Deposit soft mask
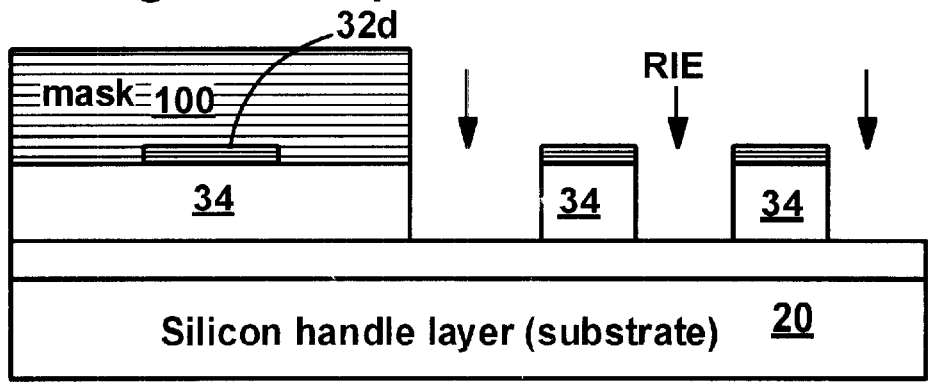
Fig. 11c: RIE
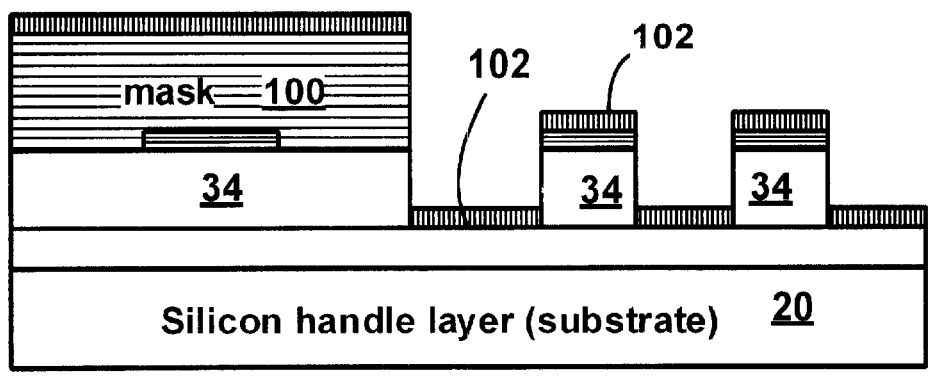
Fig. 11d: Deposit metal

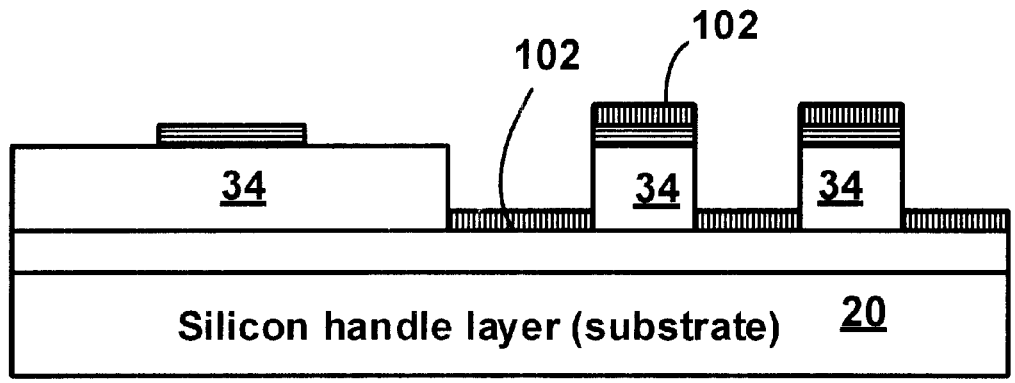
Fig. 11e: Remove mask 100
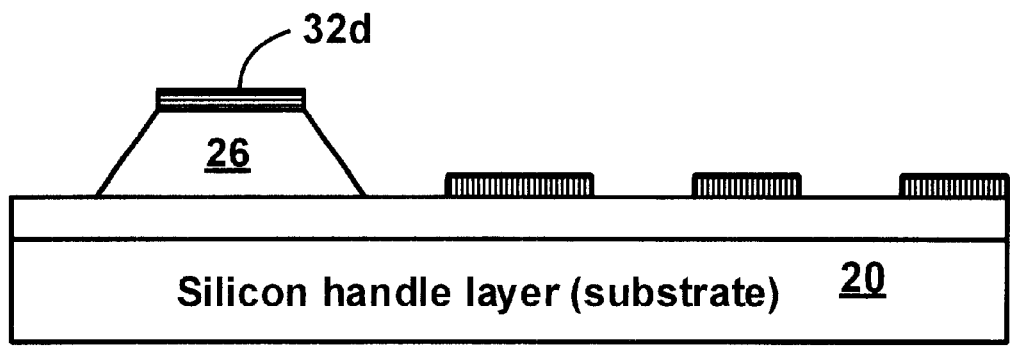
Fig. 11f: Wet etch after Fig. 11d
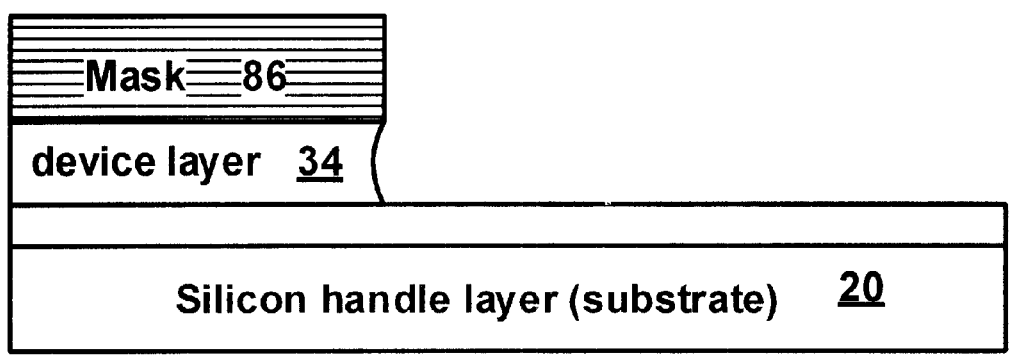
Fig. 12a: Remove device layer

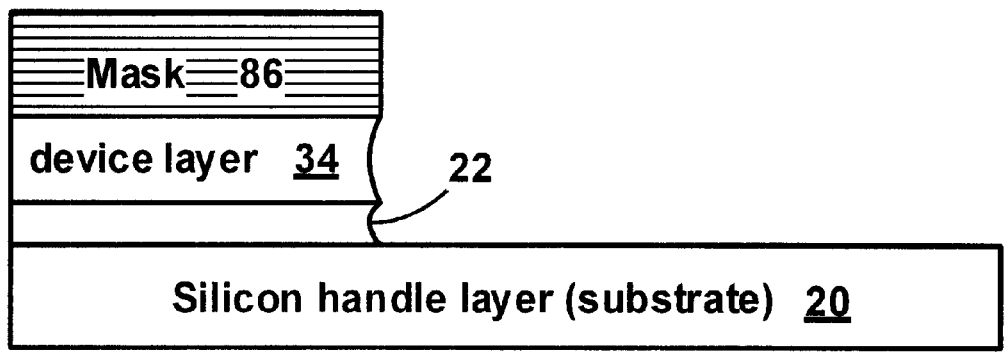
Fig. 12b: Remove etch stop layer
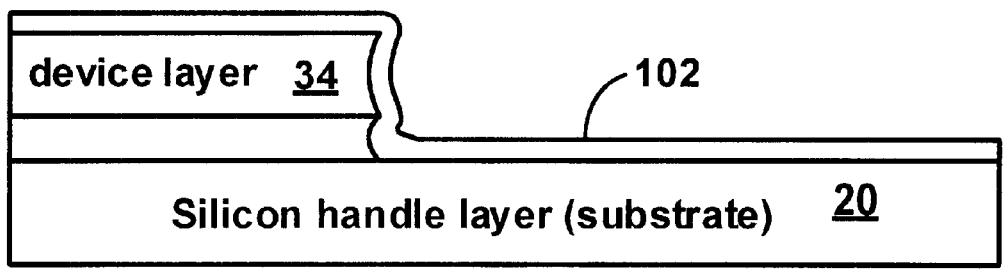
Fig. 12c: Remove mask and coat with nitride
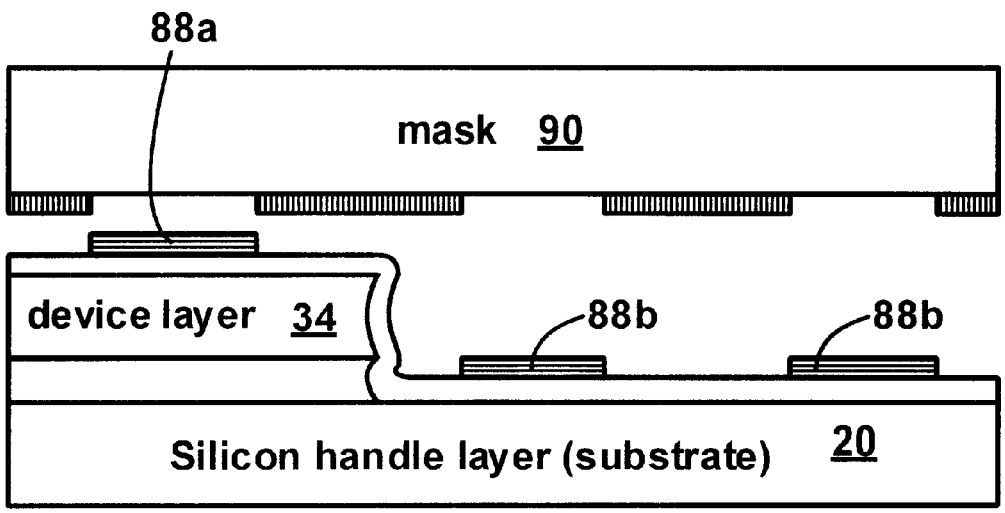
Fig. 12d: Deposit patterned metal layer

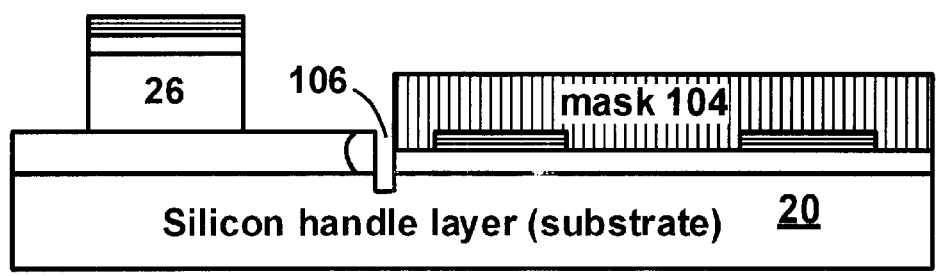
Fig. 12e: Apply mask 104 and RIE
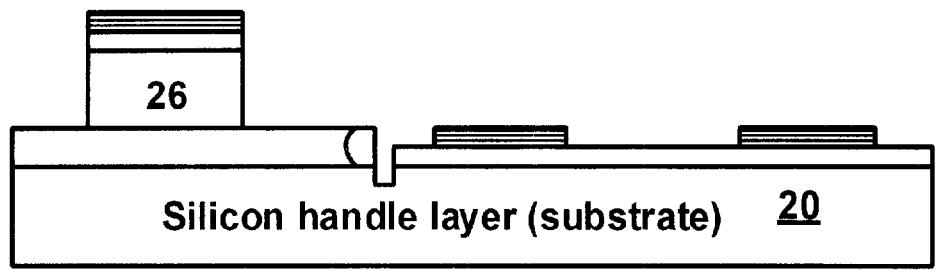
Fig. 12f: Remove mask 104
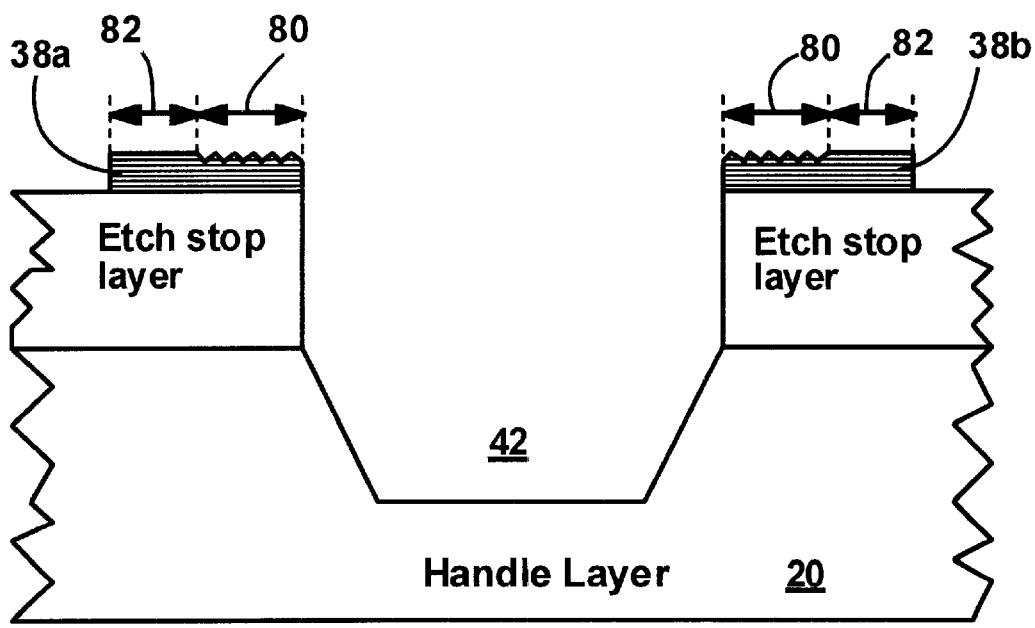
Fig. 13

SINGLE MASK TECHNIQUE FOR MAKING POSITIVE AND NEGATIVE MICROMACHINED FEATURES ON A SUBSTRATE

RELATED APPLICATIONS

The present application claims the benefit of priority under 35 U.S.C. 119(e) of copending provisional application No. 60/201,348, filed on May 2, 2000 and hereby incorporated by reference.

FIELD OF THE INVENTION

The present invention relates generally to photolithographic techniques for micromachining. More particularly, the present invention relates to a method for making positive (extending above a substrate surface) and negative (extending into the substrate surface) mechanical features. Both positive and negative features are defined according to a single mask step.

BACKGROUND OF THE INVENTION

Micromachined chips are commonly used in the fiber optics industry to build microoptical submounts. Such chips typically have etched pits for holding lenses, fibers, or active optical devices. Micromachined chips may also have posts for aligning fibers, lenses or active devices (e.g. lasers, photodetectors).

FIG. 1 shows an exemplary optical submount known in the art of microoptics. The submount has posts 10 (positive features) and V-grooves 12 (negative features). Optical fibers are disposed in the V-grooves for alignment and an optoelectronic chip is butted against the posts 10 for alignment. Together, the V-grooves 12 and posts 10 provide for accurate relative alignment between the optical fibers and the optoelectronic chip.

For the optoelectronic chip and the optical fibers to be accurately aligned, the V-grooves and posts must be accurately aligned. Accurate alignment between the posts 10 and V-grooves 12 can be difficult to assure because the posts and V-grooves are typically fabricated using different processes defined in different masking steps. Alignment between the V-grooves and posts is limited by the accuracy of mask alignment. For example, a misalignment of a V-groove mask to the posts results in a misalignment of the V-grooves with respect to the posts. Also, V-groove-post alignment is limited by problems associated with performing lithography on nonplanar surfaces.

Also, it is useful to provide metal patterns that are accurately aligned with the posts and V-grooves.

SUMMARY OF THE INVENTION

The present invention provides methods for making a micromachined device having a positive feature (e.g., a post) and a negative feature (e.g. a pit)-. In the present invention, a wafer having a device layer, an etch stop layer and a handle layer (e.g., a silicon-on-insulator, or SOI, wafer) is used.

In a first method, a patterned hard mask is disposed on top of the device layer. The device layer is directionally dry etched (e.g. by RIE or DRIE) to expose the etch stop layer in areas not covered by the hard mask. This forms a positive feature 26. Next, metal is deposited on areas of the etch stop layer exposed by the directional dry etching. Then, portions of the device layer are removed, leaving the positive feature in place (e.g. a post), and leaving the metal on the etch stop layer.

Then, optionally, the metal patterns on the etch stop layer are used as a mask to etch through the etch stop layer and expose areas of the handle layer. Then, the handle layer is etched to form negative micromachined features. The positive and negative features are defined according to the same single mask step. The handle layer can be etched using dry etching or wet (e.g. anisotropic) etching.

The positive feature can be oxidized before the handle layer is etched so that the positive feature is protected during the handle layer etch.

Alternatively, the etch stop layer is removed from areas where the device layer is etched away in the dry etching step. In this way, the device layer acts as a mask for patterning the etch stop layer. Then, the etch stop layer acts a mask to etch the handle layer. Optionally, metal is also deposited on the etch stop layer in areas where the device layer is removed.

The present invention also includes an embodiment where a metal layer is patterned on the device layer and etch stop layer after the device layer is removed. Then, the metal layer is used as a mask to etch (e.g. dry etch or wet etch) the device layer. Similarly, the metal layer is used to pattern the etch stop layer; the etch stop layer then acts as a hard mask for etching the handle layer.

The present invention also includes an embodiment where a hard mask is patterned on the device layer, and a removable mask (mask 100) is deposited on top of portions of the hard mask. Directional dry etching is performed to expose the etch stop layer. Metal is deposited on exposed areas of the etch stop layer. Then, the device layer is etched with an orientation dependent etchant (e.g. KOH or EDP on silicon).

The present invention also includes an embodiment where the device layer and etch stop layer are removed from the same area, exposing the handle layer. Then, a dielectric coating is applied to the handle layer, and a metal pattern is deposited on the dielectric coating on the device layer and on the handle layer. Then, the device layer is directionally dry etched, forming the positive feature. The handle layer is processed according to previous embodiments to form the negative feature. The dielectric coating provides electrical isolation between the metal pattern and the handle layer.

The present invention also includes a micromachined apparatus having a handle layer with a negative etched feature, an etch stop layer having a hole above the negative feature, a metal pad disposed on the etch stop layer, and a positive feature disposed on the etch stop layer. The metal pad has an inner portion adjacent to the hole, and an outer portion disposed opposite the hole. The inner portion has surface damage or surface modification not present on the outer portion. The surface modification is characteristic of etching processes used to make the hole or the negative feature. Such surface modification includes pitting, sputtering/redeposition of metal, material removal, fluoropolymer deposition, and chemical erosion.

DESCRIPTION OF THE FIGURES

FIGS. 3a–3h illustrate a method of the present invention.

FIGS. 4a–4e illustrate a preferred method where the post (the positive feature) is protected by an oxide layer during etching of the V-groove (the negative feature).

FIGS. 5a–5j illustrate a method where directionally dry etched areas of the device layer are used to pattern the etch stop layer.

FIGS. 6a–6c illustrate a method where metal is deposited on the etch stop layer adjacent to the positive feature.

FIGS. 7a–7e illustrate a method where a metal mask is patterned on the device layer and etch stop layer using a single mask step.

FIG. 8 shows a step in an alternative in the method of FIG. 7 where the positive feature is protected with a mask.

FIG. 9 shows an alternative method where the positive feature has a step.

FIG. 10 shows an alternative method where the device layer is wet etched.

FIGS. 11a–11f illustrate a method that produces a pyramidal anisotropically etched positive feature and metal patterns.

FIGS. 12a–12f illustrate an embodiment of the present invention where the etch stop layer is removed. A dielectric layer is then deposited on the exposed handle layer.

FIG. 13 shows a closeup view of a negative wet-etched feature made according to certain embodiments of the present invention and according to the methods of copending provisional application No. 09/519,165.

DETAILED DESCRIPTION

The present invention provides a method for making microoptical submounts and similar devices that require micromachined features on different vertical levels. More particularly, the present invention provides a method for making positive features (i.e. features extending above a substrate surface, such as posts) and negative features (i.e., features extending into a substrate surface, such as V-grooves or pits) according to a single initial mask step. Also, metal patterns can be formed on the substrate surface according to the single mask step. Since the positive features, negative features and metal patterns are defined in the same mask step, they are accurately located with respect to one another. The present invention also saves processing cost by reducing the number of processing steps and mask alignments.

Figure 1:
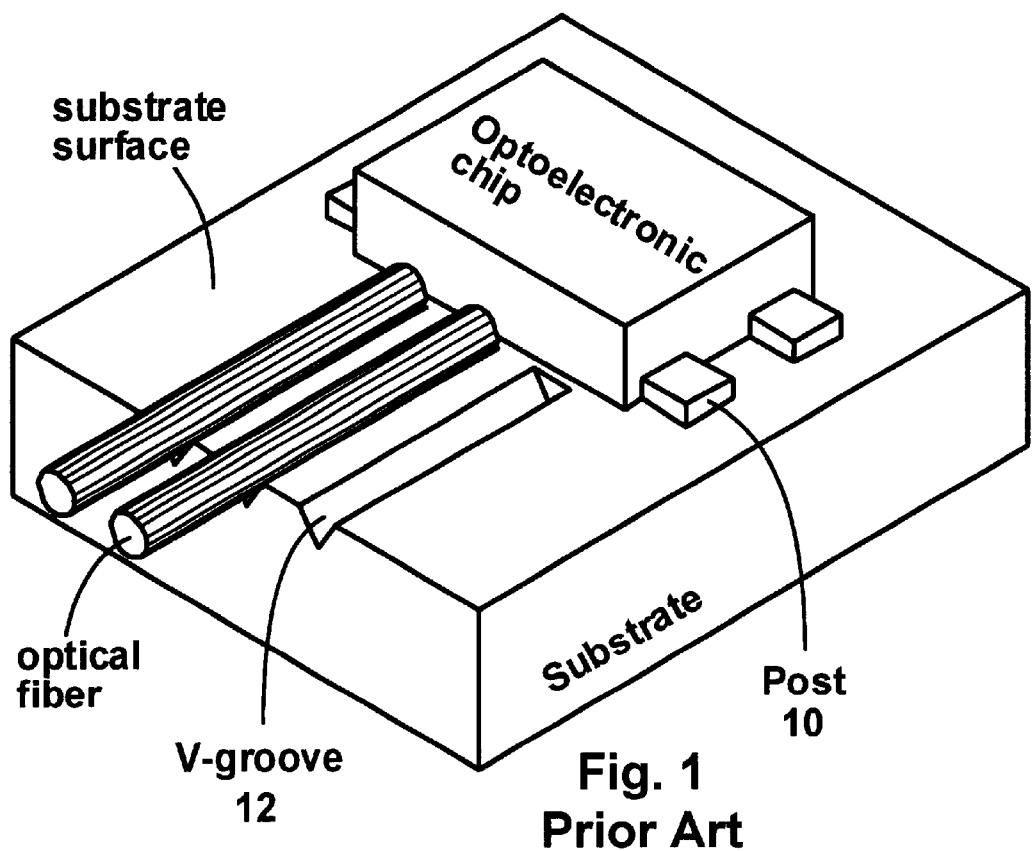
FIG. 1 (Prior Art) shows an exemplary optoelectronic submount having both positive and negative micromachined features.
Figure 2:
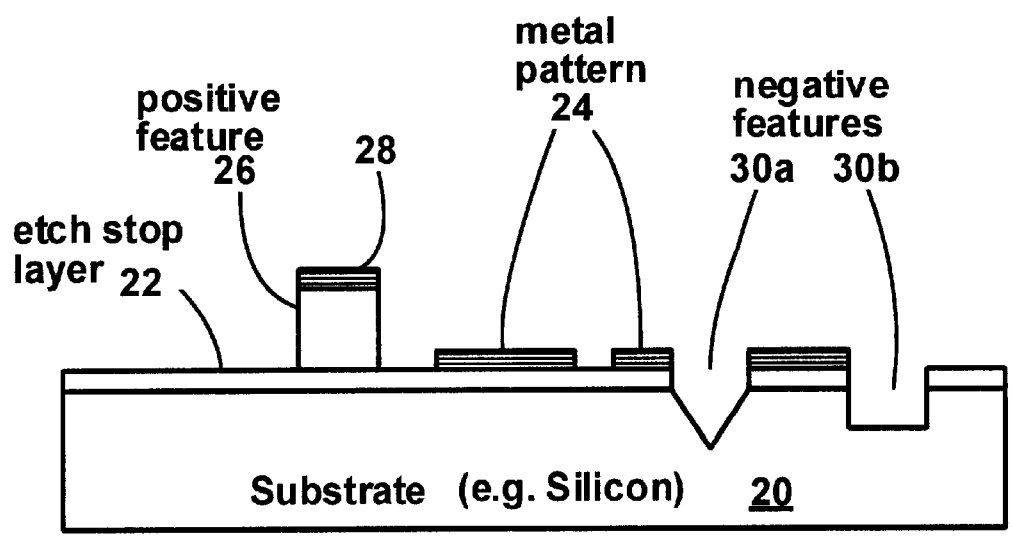
FIG. 2 shows a side view of a chip having a positive micromachined feature, a negative micromachined feature, and a metal pattern.

FIG. 2 shows a side view of a micromachined structure that can be made according to the present invention. The structure has a substrate 20 (e.g. comprising silicon) with an etch-stop layer 22 (e.g. SiO2, $Si_xN_y$, SiC) disposed on top. A metal pattern 24 is disposed on the etch stop layer 22. The metal pattern may be disposed around the edge of the negative feature (in one embodiment, the metal pattern acts as a mask for the negative feature). A positive micromachined feature 26 is also disposed on the etch stop layer. In this specific embodiment, the positive feature 26 is a post with dry-etched sidewalls (e.g. etched by reactive ion etching). The post 26 optionally has a top metal mask 28 that covers the top of the post 26. Metal mask 28 and metal pattern 24 may comprise the same or different materials (i.e., metal mask and metal pattern may or may not be deposited in the same step). The structure also has negative features: an orientation-dependent etched (ODE) V-groove 30a, and a dry-etched pit 30b. The negative features extend into the substrate 20. When this structure is made according to the present method, the metal pattern 24, post 26 and negative features 30a, 30b are all accurately located according to a single mask pattern.

A First Method of the Present Invention

FIG. 3a shows a first step in a first method of the present invention. Here, a hard mask pattern 32 is disposed on top of a device layer 34 of a silicon-on-insulator (SOI) wafer. The hard mask pattern 32 may comprise metal layers (e.g. gold, silver, aluminum, titanium, tantalum, nickel, copper, chromium, or other metals or combinations thereof), or the hard mask can comprise silicides, nitrides, oxides or other highly dry-etch resistant materials. The etch stop layer 22 is disposed between the device layer 34 and the handle layer (the substrate) 20. The device layer 34 is illustratively 1–1000 microns thick (more typically 5–100 microns thick), for example. The etch stop layer 22 is typically 0.1–5 microns thick. Typically, the etch stop layer comprises SiO2, Si3N4 or SiN or combinations thereof. The resist pattern 32 divides the wafer into three regions labeled 1, 2, and 3. In the first method of the invention, the three regions define a post, metal pattern, and V-groove as follows:

Region 1—Defines location of post;
Region 2—Defines location of metal pattern;
Region 3—Defines location of V-groove.

(It is noted that certain embodiments of the present invention do not have regions 1, 2, and 3 defined in this way.)

FIG. 3b: Vertical directional dry etching (e.g. reactive ion etching (RIE) or deep reactive ion etching (DRIE)) is used to etch through the device layer to the etch stop layer. Dry etching forms the post 26. The hard mask 32 act as a mask during this step. The hard mask 32 defines the shape and size of the post 26. RIE can be performed so that sidewalls are relatively smooth, vertical, and well-defined (the dry etch process can also produce undercut or overcut sidewalls). Corners 33 where the etch stop layer 22 meets the etched sidewalls should be well-defined by the hard mask pattern 32. Unwanted remnants of the device layer 34 are essentially the same as the post 26, but they will be removed in later steps. It is noted that bias (e.g. due to undercutting during RIE) may offset boundaries of the regions 1, 2, or 3 compared to the edges of the hard mask 32. Bias can be compensated for in the initial hard mask pattern, as is known in the art.

FIG. 3c: A mask 36 is patterned to cover the post 26 and surrounding etch stop layer. The mask 36 should be made of a material (e.g. photopatternable polyimide) that resists silicon etches such as isotropic etches (dry and/or wet) and KOH or EDP, depending on later processing steps. The mask material can be conformally applied (e.g. spray-coated or electrodeposited). Metal 38 is deposited on the etch stop layer 22. Optionally, the mask 36 is not used and the metal 38 is also deposited adjacent to the post 26. The metal 38 is optionally multilayered (e.g. titanium-nickel-gold) and designed for wetting by solder reflow for mounting optoelectronic devices. Also optionally, the metal is deposited using evaporation or other, somewhat directional deposition techniques so that metal is deposited primarily on the etch stop layer and not deposited on the etched sidewalls of the device layer 34. Sputtering can also be used to deposit the metal 38.

FIG. 3d: The exposed silicon in the device layer is removed with an isotropic or anisotropic silicon etch. The silicon etch can be a dry etch (e.g. SF6 plasma or XeF2). The mask 36 (e.g. polyimide) should be somewhat resistant to the silicon etch so that the post 26 is protected. Also, the silicon etch optionally does not attack the metal 38. The silicon etch can attack the etch stop layer 22 somewhat, because the etch stop layer is only exposed after the silicon is removed.

FIG. 3e: An RIE mask is deposited and patterned to expose the area between metal pad edges 40a, 40b. The RIE mask can be a conventional photoresist or a conformally deposited photoresist. Also, the RIE mask can be conformally deposited (e.g. spray coated or electrodeposited for example by electrophoresis).

FIG. 3f: The etch-stop layer 22 is etched away in the area between the metal pads. The etching can be performed with RIE, a wet etch or a dry etch. This exposes the silicon handle layer. The silicon handle layer is exposed in an area accurately defined by the metal pad edges 40a, 40b.

FIG. 3g: Anisotropic wet etching (e.g. using KOH or EDP) is used to form a V-groove 42. The dimensions of the V-groove are defined by the original hard mask pattern 32. The KOH also tends to attack the RIE mask. The mask 36 is resistant to KOH (e.g. polyimide is resistant to KOH). Alternatively, instead of wet etching with KOH or EDP, directional dry etching is used to form a negative feature (e.g. a pit) in the space defined by metal pad edges 40a, 40b.

FIG. 3h: The mask 36 is removed (e.g. in an oxygen plasma or wet solvent such as acetone). If the RIE mask is still present, it is also removed. The post 26, metal 38, and V-groove 42 are all defined by the original hard mask pattern 32.

Optionally, after the step of FIG. 3d, a single mask can be used in place of mask 36 and RIE mask. The single mask provides etch protection for the etch stop layer 22 during the step of FIG. 3f. In this case, the mask used in place of mask 36 and RIE mask should be resistant to both DRIE of the etch-stop layer 22, and etching the V-groove 42.

It is also noted that for a relatively thick device layer 34 (e.g. thicker than about 50 microns), the masks used (e.g. mask 36 and RIE mask) can be conformal, sprayed-on masks.

Also, it is noted that materials other than silicon can be used for the handle layer 20 and device layer 34. For example, borosilicate glass, GaAs, or ceramics can be used.

Also, the V-groove 42 can be replaced with a dry-etched pit by performing dry etching instead of anisotropic wet etching. Of course, dry etching can produce pits of many different shapes. Isotropic wet etching can also be used.

Alternative Embodiment: Post 26 is Oxidized

In this embodiment, the mask 36 is not needed to protect the post 26 during wet etching of the V-groove (in FIG. 3g). The post 26 is oxidized for protection during wet etching of the V-groove 42.

FIG. 4a: In this method, FIG. 4a follows FIG. 3d. After removal of the device layer (in FIG. 3d), the mask 36 is removed. The mask 36 can be removed using an oxygen plasma or wet solvent, for example.

FIG. 4b: After the mask 36 is removed, the post 26 is oxidized (e.g. using thermal oxidation or chemical oxidation) to form protective oxide layer 46. The post 26 can be made of silicon.

FIG. 4c: An RIE mask is patterned to expose the area between metal pad edges 40a 40b. The RIE mask can be a conventional photoresist.

FIG. 4d: The etch-stop layer 22 is etched, exposing the silicon handle layer 20. The etch stop layer can be etched with RIE, wet etching (e.g. with HF if the etch stop layer is made of SiO2) or isotropic dry etching, for example. The etch step may cause surface modification of the exposed areas of the metal pads. Surface modification may include sputtering/redeposition, pitting, material removal or fluoropolymer deposition, for example. Typically, only a portion of the metal pads will be so affected. However, it is possible to design the RIE mask so that the metal pads are completely exposed.

FIG. 4e: KOH or EDP is used to form the V-groove 42. The post 26 is protected from the anisotropic etchant by the oxide 46. EDP can be used to form the V-groove because EDP does not attack silicon dioxide (on the post 26) as much as KOH. Of course, the handle layer can be dry etched or isotropically wet etched instead.

Alternative Embodiment: Device Layer is Used as an RIE Mask

In this embodiment, the device layer is used as a mask during the step of etching through the etch-stop layer 22 (e.g. the step of FIG. 4d). In the present embodiment, depositing metal and etching the V-groove each require a separate masking step. Each masking step can be performed using a spray-on system that can conformally coat deep topology. If shallow topology is used, a spray-on system is generally not needed. Also, the mask used during the V-groove etching step must be resistant to the V-groove etchant. For etching V-grooves in silicon, the mask material can be photopatternable polyimide.

FIG. 5a: Hard mask 32 is used as a pattern during etching of the device layer 34. As in the previous embodiments, the RIE etch step should be vertical with smooth sidewalls so that corners 33 between the device layer 34 and etch stop layer 22 are well defined with respect to the hard mask 32. The RIE step also forms a post 26.

FIG. 5b: A lift off mask 52 is patterned to expose an area 50 of the etch stop layer between sidewalls of the device layer 34. The lift off mask 52 can comprise conventional photoresist.

FIG. 5c: Metal 54 is deposited so that it adheres to the etch stop layer 22. Metal 54 can be deposited by sputtering or evaporation, for example. As in the step of FIG. 3c, directional metal deposition techniques are preferred so that metal is not deposited on sidewalls of the device layer 34.

FIG. 5d: The lift off mask 52 is removed, lifting off excess metal.

FIG. 5e: A new mask 60 is applied. The new mask 60 can be a conventional photoresist, or a wet etch-resistant resist such as polyimide. The mask 60 is patterned to expose an area 62 that is to be etched.

FIG. 5f: Etching is performed in area 62 to expose silicon substrate 20. The etching can be RIE, wet etching or other dry etching.

FIG. 5g: V-groove 42 is formed using a wet etch. In this step, mask 60 should be made of polyimide or other robust patternable resist to protect post 26. If a conventional photoresist is used in the step of FIG. 5e, then it should be replaced with a more robust mask before the step of FIG. 5g.

FIG. 5h: A new mask 66 is applied that protects exposed silicon comprising the post 26 and V-groove 42.

FIG. 5i: An isotropic or anisotropic silicon etch is used to remove undesired portions of the device layer 34. The post 26 and V-groove are protected by the mask 66.

FIG. 5j: The new mask 66 is removed. This can be done using an oxygen plasma or wet solvent.

In an alternative embodiment, dry etching is used to form a pit in place of V-groove 42. In this embodiment, the new mask 60 does not need to be polyimide during the pit-etching step. The mask 60 can comprise conventional photoresist since conventional photoresist is an effective mask for dry etching but not wet etching of silicon.

Alternative Embodiment: Metal is Deposited Adjacent to Post 26

FIG. 6a: After the device layer 34 is etched (FIG. 3b), metal 38 is deposited on all exposed areas of the etch stop layer 22. In the embodiment of FIG. 6a, the post 26 is not covered by a mask. Therefore, the metal 38 is deposited adjacent to the post 26.

FIG. 6b: Next, a mask 68 (conventional photoresist or polyimide) is used to protect the post 26 so that device layer portions 34 can be removed.

FIG. 6c: Exposed areas of the device layer 34 are removed, and mask 68 is removed. Then, processing is carried out according to FIG. 3 (starting with FIG. 3d) or FIG. 4 (starting with FIG. 4a).

Also, metal can be deposited adjacent to the post 26 in the method of FIG. 5.

Alternative Embodiment: Metal Patterned on Device Layer and Etch Stop Layer from the Same Mask In this embodiment, the device layer is removed except in areas surrounding the location of the positive feature. Then, a metal mask is patterned on the device layer and the etch stop layer in the same step.

FIG. 7a: The device layer 34 is removed except in an area where the positive feature is going to be located. A mask 86 used to protect the device layer 34 does not need to be accurately defined. The device layer 34 can be removed with a wet or dry etch. A wet etch can be used so that the etch stop layer has a smooth top surface.

FIG. 7b: A patterned metal layer 88a, 88b is deposited on the device layer 34 and the etch stop layer 22, respectively. The metal layer 88 is patterned using a single contact/proximity mask 90 (e.g. using a lift-off technique or a metal-etching technique). The mask 90 is optionally a contact mask in the areas where the device layer 34 is intact; the mask 90 is a proximity mask in areas where the device layer 34 is removed and the etch stop layer 22 is exposed. Since the mask 90 is a proximity mask in areas where the device layer is removed, it is preferred in this embodiment for the device layer to be thin (e.g. less than 25, 10, or 5 microns). The metal layer 88b (on the etch stop layer 22) has improved accuracy if the device layer 34 is relatively thin (e.g. less than 5 microns thick).

The metal layer 88 can comprise many different metals or combinations of metal layers including gold, silver, aluminum, titanium, tantalum, nickel, copper, or chromium. The best metal to use generally depends on the etchants used in later steps (for example, aluminum can be attacked by KOH, and so is not a good metal to use if KOH-based etches are used in later steps).

Of course, the method of patterning the metal layer 88 is known in the art and requires several steps not illustrated including photoresist application, exposure and development.

FIG. 7c: Optionally, a protective mask 92 is disposed to cover the etch stop layer 22 and metal layer 88b on the etch stop layer. This step is optional if subsequent steps are not excessively damaging to the etch stop layer or metal layer 88b. Optionally, protective mask 92 slightly overlaps the device layer 34.

FIG. 7d: RIE is used to form the positive feature 26. The positive feature has a shape and size defined by the metal layer 88a.

FIG. 7e: The protective mask 92 is removed. After this step, the device can be processed according to FIGS. 4a–4e or FIGS. 3e–3g. Wet (isotropic) or dry etching can be used to remove the etch stop layer from an area defined by the metal pads 88b.

FIG. 8: Alternatively, after the step of FIG. 7e, a mask 94 (e.g. polyimide) is applied to protect the post 26. Then, the device can be processed according to FIGS. 3e–3g.

FIG. 9: Alternatively, the remaining device layer is not completely dry etched in the step of FIG. 7d. This provides a positive feature with a step 96.

FIG. 10: Alternatively, the positive feature 26 is formed by orientation dependent wet-etching (e.g. using KOH or EDP on silicon). In this case, the device layer top surface can have a <100> crystal orientation to produce a pyramid-shaped positive feature. Alternatively, the device top surface has a <110> or <111> crystal orientation to provide other shapes.

Alternative Embodiment: Positive Feature is Wet Etched

In this embodiment, the device layer is wet etched with an orientation dependent etch (ODE). In one embodiment, the device layer top surface is made of silicon and has a <100> crystal orientation, so that the positive feature has a pyramidal shape defined by crystal planes. Alternatively, the device layer top surface has a <111> crystal orientation or a <110> crystal orientation to produce positive features with various shapes.

FIG. 11a: First, the hard mask pattern 32 is disposed on the device layer 34.

FIG. 11b: Next, a mask 100 is disposed to cover a portion 32d of the hard mask pattern 32 and device layer 34. The mask 100 covers the hard mask 32d and an area surrounding the hard mask 32d. The mask 100 is optionally made of conventional photoresist. Optionally, the mask 100 is made of any other material that can be selectively removed from the device layer and hard mask 32d. The mask 100, for example, can also be made of polyimide or Aluminum. If the mask is made of Aluminum, it can be removed with a mild caustic that does not harm the hard mask 32d.

FIG. 11c: Directional dry etching is performed to expose the etch stop layer. The mask 100 protects a portion of the device layer larger than the hard mask 32d. In case the device layer is relatively thick (e.g. thicker than 50 microns), the mask 100 may need to be thick and highly resistant to dry etching of silicon.

FIG. 11d: Metal 102 is deposited on the device. Particularly, the metal 102 is deposited on the etch stop layer 22 so that the remaining portions of the device layer 34 define the areas of the etch stop layer covered with metal.

FIG. 11e: The mask 100 is removed. The mask 100 can be removed with a solvent, oxygen plasma, or caustic if the mask 100 is made of Aluminum.

FIG. 11f: The device is exposed to an ODE such as KOH or EDP (for silicon), removing portions of the device layer 34, and shaping the positive feature 26. The shape of the positive feature is determined by the hard mask pattern 32d.

Although the positive feature 26 is shown having a pyramidal shape, other shapes can also be produced if the device layer has certain crystal orientations. For example, a device layer having a <110> crystal orientation can produce a positive feature 26 having vertical sidewalls.

Alternatively, in the embodiment of FIG. 11, the device layer portions 34 are removed and the positive feature 26 is formed in separate steps. This will generally require additional masking and etching steps.

Alternative Embodiment: Etch Stop Layer is Removed

In this embodiment, the etch stop layer 22 is removed after a portion of the device layer 34 is removed. Removal of the etch stop layer exposes the handle layer, thereby providing a smooth, flat surface for forming the negative feature.

FIG. 12a: A mask 86 is deposited on the device layer 34, and a portion of the device layer is removed. The mask can be made of photoresist. The mask 86 should be removable without damaging the device layer 34.

FIG. 12b: The etch stop layer 22 is removed from exposed area. The etch stop layer 22 is removed by an etch that does not attack the device layer or handle layer. Optionally in this embodiment, the etch stop layer has a thickness in the range of about 0.2–4 microns.

FIG. 12c: A coating of a dielectric 102 (e.g. silicon nitride, silicon dioxide, silicon carbide) is applied. Optionally, the dielectric 102 is applied conformally. However, the dielectric can also be applied directionally to the top of the device layer and handle layer, but not on the device layer sidewalls. Also, the dielectric coating can be formed by oxidizing exposed areas of the device layer 34 and handle layer 20. Optionally, the dielectric coating has a thickness in the range of about 0.2–4 microns.

FIG. 12d: The metal layer 88 is deposited and patterned on top of the dielectric layer 102, and on top of the handle layer 20. The dielectric layer 102 provides electrical isolation between the metal pattern and the handle layer.

Of course, the method of patterning the metal layer 88 is known in the art and requires several steps not illustrated including photoresist application, exposure and development.

FIG. 12e: A mask 104 is applied to cover areas of the handle layer that will be micromachined in subsequent steps. The mask 104 can comprise conventional photoresist. After the mask 104 is applied, DRIE is used to etch the device layer and form the positive feature 26. The DRIE step may produce a small pit 106 (e.g. having a width of about 1–3 microns) between the mask 104 and the device layer sidewall (not visible in FIG. 12e).

FIG. 12f: Mask 104 is removed. After the mask is removed, the positive feature 26 can be oxidized for etchant resistance and the device processed according to FIGS. 4b–4e. Alternatively, the positive feature is covered with a protective mask (not shown) and the device is processed according to FIGS. 3e–3h.

Several embodiments of the present invention (with the exception of the embodiments of FIG. 7 and FIG. 12) rely upon directional dry etching of the device layer to transfer hard mask patterns on top of the device layer to the etch stop layer. This provides features on the etch stop layer and handle layer that are accurately located with respect to features on the device layer. Transfer of the hard mask pattern by etching is generally more accurate than optical transmission of a pattern over the same distance. This is because etching can be more directional than light propagation. Patterns transferred by light are distorted by diffraction. Also, etching tends to preserve sharp pattern edges, whereas light diffraction tends to blur pattern edges.

It is noted in the present invention that the directional dry etching steps used to etch the device layer do not need to be accurately vertical. For example, the directional dry etching can cause a certain amount of undercutting (e.g. 1–4 degrees of undercutting). Well-defined undercutting can still provide accurate alignment of features on the etch stop layer if positional bias is accounted for in mask design. Also, a positive feature 26 with an undercut sidewall can provide improved mechanical alignment for optoelectronic devices butted against the positive feature 26.

Certain embodiments of the present invention employ process steps common to copending patent application Ser. No. 09/519,165, filed on Mar. 6, 2000 and herein incorporated by reference. Application Ser. No. 09/519,165 describes single mask methods for making metallizations and negative features (e.g. V-grooves, etched pits and the like).

Accordingly, the negative features (e.g. pits, v-grooves) and metal pads in the present invention can have many of the same features described in copending application Ser. No. 09/519,165. FIG. 13 for example, shows a close-up view of a V-groove 42 made according to the present invention. Metal pads 38a, 38b are generally divided into two parts: an inner portion 80, and an outer portion 82. The inner portion 80 (directly adjacent to the V-groove 42) is exposed to the RIE step that removed the etch stop layer 22; the outer portion 82 is protected by the mask (e.g. RIE mask in FIG. 3f or 4d, or mask 60 in FIG. 5f). Therefore, the inner portion 80 will have surface damage (e.g. metal removal, material removal, surface roughening, pitting, fluoropolymer deposition (often caused by RIE/DRIE processes that use fluorine-based etchants), metal sputtering/redeposition (often caused by RIE or DRIE processes), chemical erosion (often caused by caustic or acidic etchants) or other kinds of surface modification that is not present on the outer portion 82.

It will be clear to one skilled in the art that the above embodiment may be altered in many ways without departing from the scope of the invention. Accordingly, the scope of the invention should be determined by the following claims and their legal equivalents.

What is claimed is:

1. A method for making a micromachined device comprising a positive feature and a metallization, comprising the steps of:
   a) providing a substrate comprising a device layer, a handle layer, and an etch-stop layer disposed between the device layer and the handle layer;
   b) disposing a patterned mask on top of the device layer;
   c) directionally dry etching the device layer to expose the etch stop layer in an area not covered by the mask, so that a positive feature is formed from the device layer, whereby the positive feature is defined by the mask;
   d) depositing metal on the exposed area of the etch stop layer;
   e) removing a portion of the device layer adjacent to the metal deposited in step (d) so that an area of the etch stop layer is exposed and so that the positive feature remains.

2. The method of claim 1 further comprising the steps of:
   f) removing the etch stop layer from an area exposed in step (e), whereby an area of the handle layer is exposed;
   g) etching the handle layer in the area exposed in step (f) to form a negative feature.

3. The method of claim 2 further comprising the step of oxidizing the positive feature so that the positive feature is protected during etching of the handle layer.

4. The method of claim 2 wherein step (g) is performed using an orientation dependent etch.

5. The method of claim 2 further comprising the step of masking the positive feature so that the positive feature is protected during etching of the handle layer.

6. The method of claim 1 further comprising the step of masking the positive feature so that the positive feature is protected during removal of the device layer.

7. The method of claim 1 wherein the patterned mask comprises a metal.

8. A method for making a micromachined device comprising a positive feature and a negative feature, comprising the steps of:
   a) providing a substrate comprising a device layer, a handle layer, and an etch-stop layer disposed between the device layer and the handle layer;
   b) disposing a patterned mask on top of the device layer;
   c) directionally dry etching the device layer to expose the etch stop layer in an area not covered by the mask, so that a positive feature is formed from the device layer, whereby the positive feature is defined by the mask;
   d) removing the etch stop layer from the area exposed in step (c) so that an area of the handle layer is exposed;

e) etching the handle layer in the area exposed in step (d) to form the negative feature.

9. The method of claim 8 further comprising the step of removing a portion of the device layer after step (d) so that the positive feature remains.

10. The method of claim 9 wherein the portion of the device layer removed is adjacent to the negative feature.

11. The method of claim 8 further comprising the step of metallizing the etch stop layer in an area exposed during step (c), wherein the area metallized is different from the area where the etch stop layer is removed in step (d).

12. The method of claim 11 further comprising the step of removing a portion of the device layer adjacent to the area metallized.

13. The method of claim 8 wherein the patterned mask comprises a metal.

14. The method of claim 8 wherein step (e) is performed using an orientation dependent etch.

15. A method for making a micromachined device comprising a positive feature and a negative feature, comprising the steps of:
   a) providing a substrate comprising a device layer, a handle layer, and an etch-stop layer disposed between the device layer and the handle layer;
   b) removing a portion of the device layer to expose an area of the etch stop layer, wherein a portion of the device layer remains;
   c) after step (b), patterning a mask layer simultaneously on the remaining device layer and the etch stop layer;
   d) after step (c), etching the remaining device layer so that a positive feature is formed from the remaining device layer, wherein the positive feature is defined by the mask layer on the device layer;
   e) removing the etch stop layer from an area at least partially defined by the mask layer on the etch stop layer, thereby exposing the handle layer;
   f) etching the handle layer in the area exposed in step (e) to form the negative feature.

16. The method of claim 15 further comprising the step of oxidizing the positive feature before step (e) so that the positive feature is protected during etching of the handle layer.

17. The method of claim 15 wherein step (d) is performed by directional dry etching or RIE.

18. The method of claim 17 wherein the dry etching of step (d) is stopped before the device layer is completely removed so that a step is formed.

19. The method of claim 15 wherein step (d) is performed by orientation dependent wet etching.

20. The method of claim 15 wherein the mask layer comprises a metal, SiO2, silicon nitride, or a metal silicide.

21. A method for making a micromachined device comprising a positive feature and a negative feature, comprising the steps of:
   a) providing a substrate comprising a device layer, a handle layer, and an etch-stop layer disposed between the device layer and the handle layer;
   b) disposing a patterned hard mask on top of the device layer;
   c) covering a portion of the patterned hard mask and device layer with a mask resistant to directional dry etching;
   d) directionally dry etching the device layer to expose the etch stop layer in an area not covered by the hard mask and not covered by the mask;
   e) depositing metal on the exposed area of the etch stop layer;
   f) removing portions of the device layer that were not under the mask during step (d);
   g) removing a portion of the device layer that was under the mask using an orientation dependent etch so that a positive feature is created, wherein the positive feature is defined by crystal planes of the device layer and a portion of the hard mask.

22. The method of claim 21 wherein the device layer has a crystal orientation selected so that the positive feature has a pyramidal shape.

23. The method of claim 21 wherein the device layer has a crystal orientation selected so that the positive feature has a sidewall perpendicular to the etch stop layer.

24. The method of claim 21 wherein steps (f) and (g) are performed simultaneously.

25. The method of claim 21 wherein the device layer comprises single crystal silicon and the device layer has a top surface with a <100> crystal orientation.

26. The method of claim 21 wherein the device layer comprises single crystal silicon and the device layer has a top surface with a <110> crystal orientation.

27. The method of claim 21 wherein the patterned hard mask comprises a material selected from the group consisting of metal and silicon nitride.

28. A method for making a micromachined device comprising a positive feature, comprising the steps of:
   a) providing a substrate comprising a device layer, a handle layer, and an etch-stop layer disposed between the device layer and the handle layer;
   b) removing a portion of the device layer to expose an area of the etch stop layer, wherein a portion of the device layer remains;
   c) after step (b), removing the exposed portion of the etch stop layer so that the handle layer is exposed;
   d) depositing a dielectric coating on top of the handle layer and on top of the device layer;
   e) patterning a metal layer simultaneously on the dielectric coating on top of the device layer and on top of the handle layer;
   f) after step (c), etching the remaining device layer so that a positive feature is formed from the remaining device layer, wherein the positive feature is defined by the metal layer on the device layer.

29. The method of claim 28 further comprising the steps of
   g) removing the dielectric coating from an area at least partially defined by the metal layer on the handle layer, thereby exposing the handle layer;
   h) etching the handle layer in the area exposed in step (g) to form the negative feature.

30. The method of claim 28 further comprising the step of oxidizing the positive feature before step (g) so that the positive feature is protected during etching of the handle layer.

31. The method of claim 28 wherein step (f) is performed by directional dry etching.

32. The method of claim 28 wherein the dry etching of step (f) is stopped before the device layer is completely removed so that a step is formed.

33. The method of claim 28 wherein step (f) is performed by orientation dependent wet etching.

34. A micromachined apparatus comprising:

a) a handle layer comprising a negative feature;

b) an etch stop layer disposed on the handle layer, and comprising a hole exposing the negative feature;

c) a metal pad disposed on the etch stop layer adjacent to the negative feature and hole, wherein the metal pad comprises:

1) an inner portion adjacent to the hole and the negative feature, 2) an outer portion disposed opposite the hole and the negative feature, wherein the inner portion has a surface modification characteristic of etching processes used to make the hole or the negative feature; and wherein the outer portion does not have the surface modification characteristic; and d) a positive feature disposed on the etch stop layer.

35. The apparatus o claim 34 further comprising a metal pattern disposed on the etch stop layer.

36. The apparatus of claim 34 wherein the positive feature has approximately vertical dry etched sidewalls.

37. The apparatus of claim 34 wherein the handle layer comprises single crystal silicon.

38. A method for making a micromachined device comprising a positive feature and a metallization, comprising the steps of:

a) providing a substrate comprising a device layer, a handle layer, and an etch-stop layer disposed between the device layer and the handle layer;

b) disposing a patterned mask on top of the device layer;

c) etching the device layer to expose the etch stop layer in an area not covered by the mask, so that a positive feature is formed from the device layer, whereby the positive feature is defined by the mask;

d) depositing metal on the exposed area of the etch stop layer;

e) removing a portion of the device layer adjacent to the metal deposited in step (d) so that an area of the etch stop layer is exposed and so that the positive feature remains.

39. A method for making a micromachined device comprising a positive feature and a negative feature, comprising the steps of:

a) providing a substrate comprising a device layer, a handle layer, and an etch-stop layer disposed between the device layer and the handle layer;

b) disposing a patterned mask on top of the device layer;

c) etching the device layer to expose the etch stop layer in an area not covered by the mask, so that a positive feature is formed from the device layer, whereby the positive feature is defined by the mask;

d) removing the etch stop layer from the area exposed in step (c) so that an area of the handle layer is exposed;

e) etching the handle layer in the area exposed in step (d) to form the negative feature.

* * * * *